United States Patent [19]

Kumar

[11] Patent Number: 4,611,184

[45] Date of Patent: Sep. 9, 1986

[54] MICROWAVE FREQUENCY POWER DIVIDER

[75] Inventor: Mahesh Kumar, So. Brunswick Township, Middlesex County, N.J.

[73] Assignee: RCA Corporation, Princeton, N.J.

[21] Appl. No.: 630,840

[22] Filed: Jul. 13, 1984

[51] Int. Cl.⁴ .......................................... H03H 11/36
[52] U.S. Cl. .................................... 333/100; 307/304; 333/128; 357/22
[58] Field of Search ................ 333/124, 125, 128, 100; 307/304; 357/23.1, 41, 22 G, 22 P, 22 S

[56] References Cited

U.S. PATENT DOCUMENTS

| | | | |
|---|---|---|---|
| 3,135,926 | 6/1964 | Bockemuehl | 307/304 X |
| 3,714,523 | 1/1973 | Bate | 307/304 X |
| 3,872,491 | 3/1975 | Hanson et al. | |
| 4,015,278 | 3/1977 | Fukuta | 357/22 |
| 4,254,430 | 3/1981 | Beneking | 357/22 |
| 4,308,473 | 12/1981 | Carnes | |
| 4,315,272 | 2/1982 | Vorhaus | |
| 4,372,032 | 2/1983 | Collins et al. | |
| 4,380,022 | 4/1983 | Yoder | 357/22 |
| 4,399,439 | 8/1983 | Upadhyayula | 330/124 R |
| 4,472,691 | 9/1984 | Kumar et al. | 333/136 X |
| 4,511,813 | 4/1985 | Pan | 333/128 X |

*Primary Examiner*—Paul Gensler
*Attorney, Agent, or Firm*—Joseph S. Tripoli; Robert L. Troike; Raymond E. Smiley

[57] ABSTRACT

An in-phase power divider is constructed of a double field-effect transistor having a common source, first and second gates and first and second drains. The gates are coupled together and adapted to receive a radio frequency signal of power P to be power divided. The power divided output signals each at substantially $P \div 2$ or more appear at the drains. An alternative power divider for producing unequal power division is constructed of a double dual gate FET having, in addition to the above-mentioned elements, third and fourth gates. By appropriate unequal application of gate bias to the additional gates unequal power division is effected.

1 Claim, 4 Drawing Figures

MICROWAVE FREQUENCY POWER DIVIDER

CROSS REFERENCE TO RELATED APPLICATION

U.S. patent application Ser. No. 630,839 filed July 13, 1984 discloses a power combiner circuit.

The present invention, relates to a microwave frequency power divider, and more particularly to such a divider which exhibits no power loss in signal passage through the divider and may provide signal gain.

BACKGROUND OF THE INVENTION

Many applications involve circuits requiring a power signal to be divided into two or more paths to be operated on by following circuits. Known prior art circuits for accomplishing power division are passive, that is not including active devices. Such circuits exact a penalty in that the total output power is less than the input power by, for example five to ten percent, the loss increasing with increasing frequency. Furthermore, where greater than two-way power division is required, it is common to cascade two or more power dividers to accomplish the task with consequent increase in power loss. In some applications it is desirable to have unequal power division such that, by way of example, for an input of power P, output powers of two-thirds P and one-third P (ignoring losses in the divider) exists. In such circuits, as with equal power division circuits, a loss is incurred in passing through the power divider.

SUMMARY OF THE INVENTION

In accordance with a preferred embodiment of the invention a microwave frequency power divider comprises a double field-effect transistor (FET) comprising a common source, first and second gate electrodes, and first and second drain electrodes, said first and second gate electrodes being coupled together and adapted to receive a signal of power P to be divided in power, each of said first and second drain electrodes being adapted to provide output power P1 and P2, respectively, which is a fraction of said input power, said FET being adapted to receive gate-source bias and drain-source bias in values such that $P_1$ plus $P_2$ is at least equal to P.

DETAILED DESCRIPTION

Figure 1:
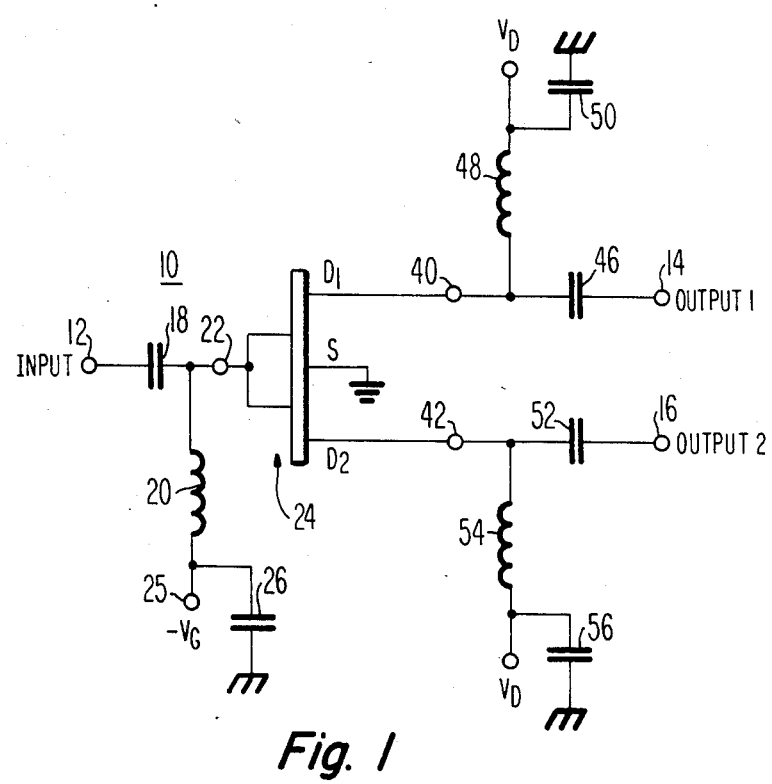
FIG. 1 is a double FET illustrated in electrical schematic form and adapted for power dividing an input signal into two output signals of equal power, the total of which is approximately equal to or greater than the power of the input signal.

Referring to FIG. 1, FET inphase power divider circuit 10 includes a circuit input terminal 12 and first and second circuit output terminals 14 and 16, respectively. Input terminal 12 is connected to a radio frequency (RF) coupling (dc blocking) capacitor 18. Capacitor 18 is connected to an RF choke 20 and to gate terminal 22 of FET 24 which is typically a gallium arsenide GaAs FET operated in the depletion mode. Choke 20 is connected to a terminal 25 receptive of gate bias power supply $-V_G$ and to an RF bypass capacitor 26.

Figure 2:
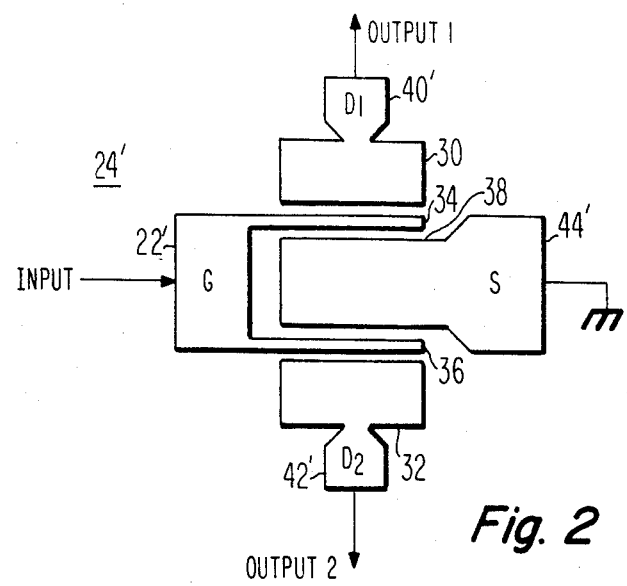
FIG. 2 is an FET chip which is useful in constructing in monolithic form the FET circuit illustrated in FIG. 1.

Transistor 24 is physically and electrically of unique design. A preferred physical arrangement of the transistor is as illustrated in FIG. 2 to which attention is now directed. FIG. 2 illustrates an FET ship 24' suitable for practicing the invention utilizing monolithic technology. Chip 24' is physically equivalent to FET 24, FIG. 1. Chip 24' includes first and second drain electrodes 30 and 32, first and second gate electrodes 34 and 36 and source electrode 38. The first and second gate electrodes are of the same length and width respectively. The first and second drain electrodes are of the same length and width respectively. Gate electrodes 34 and 36 are connected to a common gate pad 22' which is physically equivalent to terminal 22 in FIG. 1. Drain electrode 30 is connected to drain pad 40' which is physically equivalent to terminal 40 in FIG. 1. Drain electrode 32 is connected to drain pad 42' which is physically equivalent to terminal 42 in FIG. 1. Source electrode 38 is connected to a source pad 44' which is in turn connected to system ground.

Returning to FIG. 1, transistor 24 first drain terminal 40 is coupled to RF coupling capacitor 46 and to RF choke 48. Choke 48 is coupled to a source of drain bias $V_D$ and to RF bypass capacitor 50 which is connected to system ground. RF coupling capacitor 46 is connected to circuit output terminal 14. Similarly, drain $D_2$ at terminal 42 is connected to RF coupling capacitor 52 which is connected to circuit output terminal 16 and to RF choke 54. RF choke 54 is connected to drain bias source $V_D$ and to RF bypass capacitor 56.

Operation of the power divider of FIG. 1 is as follows. An input signal of power P is input at terminal 12. Transistor 24 to which input power is passed to the double gate thereof splits the power in half, thus producing at each of output terminals 14 and 16 power which is at least one-half P. Because the gate electrodes 34 and 36 (FIG. 2) are of same length and width, equal power division results. As opposed to the prior art circuits for power division there is no loss in signal passage through transistor 24 and associated circuitry and to the contrary by a proper source of gate and drain biases transistor 24 can actually be configured to amplify the incoming signal such that the total of the output power at terminals 14 and 16 is greater than the input power at terminal 12. As an example with $-V_G = -2$ volts and $V_D = 5$ volts a total power gain of 5 dB may be realized.

Transistor 24' can be thought of as two single-gate FETs sharing a common source. It will be understood that the various capacitors and chokes illustrated in FIG. 1 can be monolithically integrated in a physical realization of a power divider on the same substrate that contains FET 24'.

Figure 3:
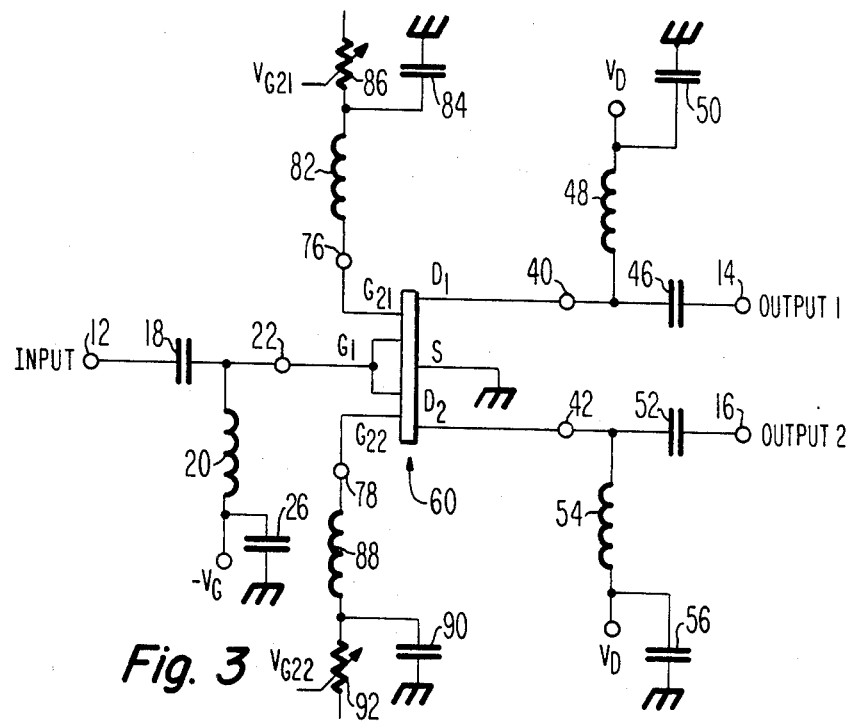
FIG. 3 is a dual-gate double FET illustrated in electrical schematic form and adapted for power dividing an input signal into two output signals which may be of unequal power but wherein the total output power is approximately equal to or greater than the total input power.

There are situations in which it is desirable to have unequal power division. A circuit for accomplishing that task is illustrated in FIG. 3 to which attention is now directed. As with the circuit of FIG. 1, the circuit of FIG. 3 includes an input terminal 12 and output terminals 14 and 16. Various chokes and capacitors are as illustrated in FIG. 1 and are similarly numbered in FIG. 3. Transistor 60 in FIG. 3 differs from transistor 24 in FIG. 1 in that it can be considered a double dual-gate transistor.

Figure 4:
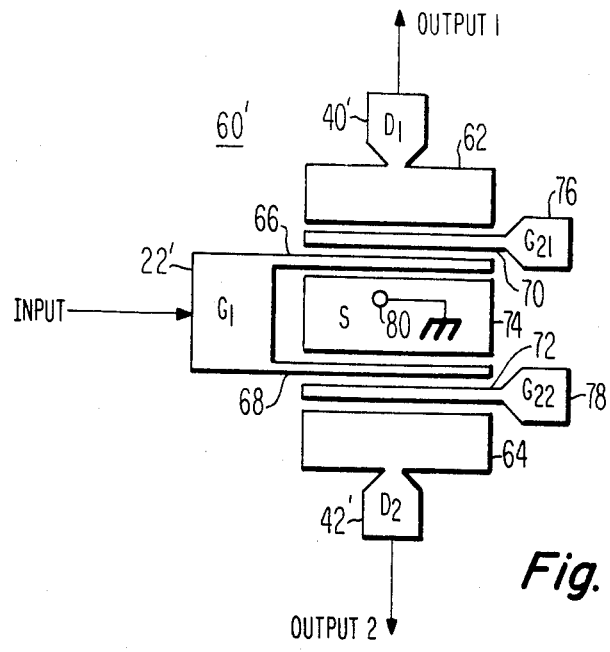
FIG. 4 is an FET chip which is useful in constructing, in monolithic form, the FET circuit illustrated in FIG. 3.

A typical chip layout for realization in monolithic form is as illustrated in FIG. 4 to which attention is now directed. FET chip 60' comprises first and second drain electrodes 62 and 64, first, second, third and fourth gate electrodes 66, 68, 70 and 72, and a common source electrode 74. Gate electrodes 66 and 68 are similar to gate electrodes 34 and 36 in FIG. 2 and are connected together to a common gate pad 22' corresponding to terminal 22 in FIG. 3. Similarly, drain electrodes 62 and 64 are similar to drain electrodes 30 and 32 in FIG. 2 and are similarly connected respectively to drain pads 40' and 42'.

The main difference between the FET of FIG. 2 and the FET of FIG. 4 lies in the additional gates in FIG. 4. Additional second gate electrode 70 is connected to a gate pad 76 also termed gate $G_{21}$ while additional gate electrode 72 is connected to a gate pad 78 also referred to as gate $G_{22}$. Due to the physical structural arrangement in FIG. 4 the source electrode 74 is not able to be connected directly to ground as was true of the FET chip of FIG. 2. Therefore, circle 80 represents a via hole (conductive path) to the opposite side of the substrate (not illustrated) forming FET chip 60'. The opposite side of the substrate is at system ground and that is what is represented by the ground symbol connected to circle 80 in FIG. 4.

Returning to FIG. 3, additional gate terminal $G_{21}$ at terminal 76 is coupled through RF choke 82 to a grounded RF bypass capacitor 84 and to a variable gate bias power supply $V_{G21}$ illustrated as being connected to a variable resistor 86. Similarly, second gate terminal $G_{22}$ at terminal 78 is connected through choke 88 to a grounded RF bypass capacitor 90 and to an adjustable source of gate bias potential illustrated as connected to a variable resistor 92.

Operation of the circuit of FIG. 3 is similar to the operation of the circuit of FIG. 1 except that an input signal of power level P at terminal 12 is, by means of the circuit of FIG. 3, able to be divided into two output signals of unequal power but having a total output power of approximately P. The amount of unequal power division is determined by the value of gate bias supplied to terminals 76 and 78, respectively. When the bias voltages at terminals 76 and 78 are the same, the power divider of FIG. 3 operates as an equal power divider and thus operates as the circuit of FIG. 1. In this case, power is divided equally having gain (5~10 dB for 0 volts applied to terminals 76 and 78) at each output terminal 14 and 16 (FIG. 3) (or 40', 42' of FIG. 4). Thus, the power at each output terminal 40' and 42' (FIG. 4) is more than the total input power. By applying different negative biases at terminals 76 and 78 the gain of each FET can be varied from, for example, +5 dB to −35 dB by applying $V_{G21}$ or $V_{G22}$ from OV to −4V (Ref.: M. Kumar and H. Huang, "Dual-Gate MESFET Variable Gain Constant Output Power Amplifier", IEEE Transactions on Microwave Theory and Techniques, Vol. MTT-29, No. 3, pp. 185–189, March 1981.

Thus, the amplitude of power appearing at terminals 14 and 16 can be varied relative to one another. By the proper combination of the second gate biases at terminals 76 and 78, there can be provided any ratio of two output powers at terminals 14 and 16, thus making this device a variable divider.

What is claimed is:

1. A radio frequency signal power divider comprising, in combination:

a double field-effect transistor (FET) comprising a common source, first and second drain electrodes, and first, second, third and fourth gate electrodes being coupled together for receiving a signal of power P to be divided in power, each of said first and second drain electrodes being responsive to input power P for generating output power P1 and P2, respectively, which each of P1 and P2 being a fraction of said input power, said FET having means for receiving gate-source bias and drain-source bias of values such that, when said gate-souce bias and drain-source bias are present P1 plus P2 is equal to or greater than P;

means providing adjustable gate-source bias to said third and fourth gate electrodes for determining, by the amount of gate-source bias applied to each electrode, the fraction that P1 is to P and that P2 is to P, said first gate electrode and third gate electrode being positioned between said common source and first drain said second gate electrode and fourth gate electrode being positioned between said common source and said second drain, said first and second gate electrodes being relatively nearer to said common source, said third and fourth gate electrodes being relatively nearer to said first drain and second drain electrodes, respectively; and a gallium arsenide substrate, said electrodes being on one side of said gallium arsenide substrate, said source being connected through said gallium arsenide substrate by means of a via hole to the side of the gallium arsenide substrate opposite that which contains said gate, source and drain electrodes.

* * * * *